United States Patent
Choi et al.

(10) Patent No.: US 7,994,625 B2
(45) Date of Patent: Aug. 9, 2011

(54) INTEGRATED CIRCUIT PACKAGING SYSTEM HAVING AN INTERNAL STRUCTURE PROTRUSION AND METHOD OF MANUFACTURE THEREOF

(75) Inventors: DaeSik Choi, Seoul (KR); DeokKyung Yang, Hanam-si (KR); Jong-Woo Ha, Seoul (KR); Byoung Wook Jang, Yong-in (KR); JaeSick Bae, Seoul (KR); Seung Won Kim, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/273,540

(22) Filed: Nov. 18, 2008

(65) Prior Publication Data

US 2010/0123232 A1  May 20, 2010

(51) Int. Cl.
*H01L 23/48* (2006.01)
(52) U.S. Cl. ......... 257/686; 257/777; 257/782; 438/109
(58) Field of Classification Search .................. 257/686, 257/777, 782, 787, E23; 438/109
See application file for complete search history.

(56) References Cited

U.S. PATENT DOCUMENTS

| | | | |
|---|---|---|---|
| 7,250,677 | B1 | 7/2007 | Lin |
| 7,253,511 | B2 | 8/2007 | Karnezos et al. |
| 2003/0134451 | A1 | 7/2003 | Chen |
| 2007/0158810 | A1* | 7/2007 | Song et al. .......... 257/686 |
| 2009/0072375 | A1* | 3/2009 | Song et al. .......... 257/686 |

* cited by examiner

*Primary Examiner* — Theresa T Doan
(74) *Attorney, Agent, or Firm* — Mikio Ishimaru

(57) ABSTRACT

A method of manufacture of an integrated circuit packaging system includes: providing an internal structure substrate having an internal structure substrate cavity; mounting an internal structure die above the internal structure substrate; encapsulating the internal structure die with an internal structure encapsulation to form an internal structure package; forming an internal structure protrusion in the internal structure encapsulation below the internal structure substrate cavity; mounting the internal structure package above a substrate; and encapsulating the internal structure package above the substrate with an encapsulation.

20 Claims, 5 Drawing Sheets

INTEGRATED CIRCUIT PACKAGING SYSTEM HAVING AN INTERNAL STRUCTURE PROTRUSION AND METHOD OF MANUFACTURE THEREOF

TECHNICAL FIELD

The present invention relates generally to integrated circuits and more particularly to a system for utilizing a protruding internal structure mold in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses, and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an internal structure substrate having an internal structure substrate cavity; mounting an internal structure die above the internal structure substrate; encapsulating the internal structure die with an internal structure encapsulation to form an internal structure package; forming an internal structure protrusion in the internal structure encapsulation below the internal structure substrate cavity; mounting the internal structure package above a substrate; and encapsulating the internal structure package above the substrate with an encapsulation.

The present invention provides an integrated circuit packaging system including: an internal structure substrate having an internal structure substrate cavity; an internal structure die mounted above the internal structure substrate; an internal structure encapsulation encapsulating the internal structure die to form an internal structure package; an internal structure protrusion formed in the internal structure encapsulation below the internal structure substrate cavity; a substrate mounted below the internal structure package; and an encapsulation encapsulating the internal structure package above the substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
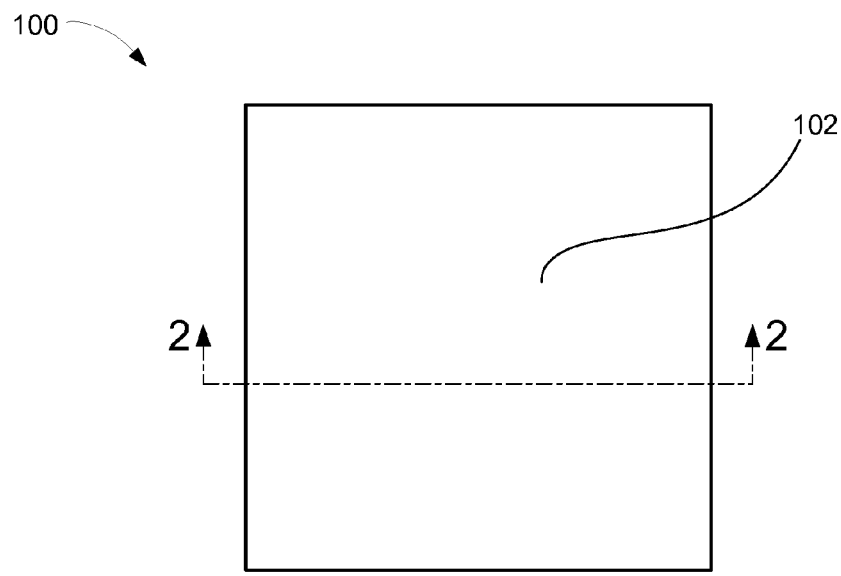
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown having an encapsulation 102. The encapsulation 102, such as film assisted molding, protects sensitive components from moisture, dust and other contamination.

Figure 2:
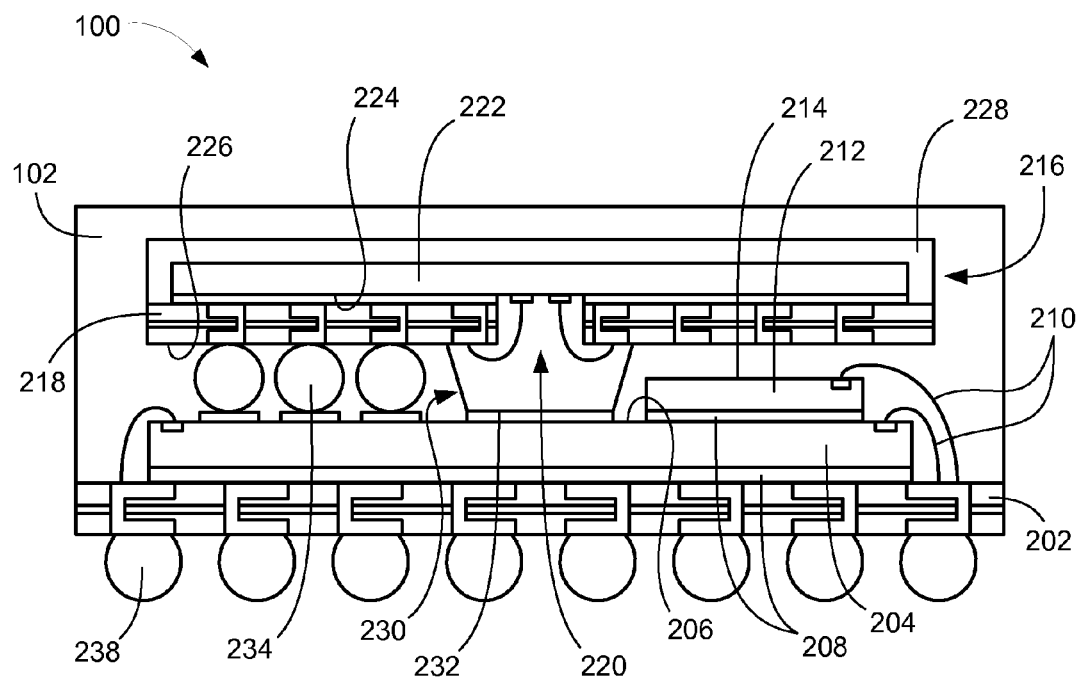
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202 such as a ceramic or a laminated plastic substrate.

Mounted above the substrate 202 is a first integrated circuit such as a first wire-bonded die 204 with an active side 206. The first wire-bonded die 204 is attached to the substrate with a die attach adhesive 208.

The active side 206 of the first wire-bonded die 204 is connected to the substrate with interconnects such as bond wires 210. Mounted above the first wire-bonded die 204 is a second integrated circuit such as a second wire-bonded die 212 with an active side 214.

The second wire-bonded die 212 is attached to the active side 206 of the first wire-bonded die 204 with the die attach adhesive 208. The active side 214 of the second wire-bonded die is connected to the substrate 202 with the bond wires 210.

Mounted above the first wire-bonded die 204 and the second wire-bonded die 212 is an internal structure package 216. The internal structure package 216 has an internal structure substrate 218 with an internal structure substrate cavity 220.

The internal structure substrate cavity 220 of the internal structure substrate 218 exposes an internal structure die 222 between the internal structure substrate 218. The internal structure die 222 has an active side 224, which is attached to the internal structure substrate 218 with the die attach adhesive 208.

The active side 224 of the internal structure die 222 is connected to a bottom side 226 of the internal structure substrate 218 with the bond wires 210 going through the internal structure substrate cavity 220. The bond wires 210 going through the internal structure substrate cavity 220 are encapsulated in an internal structure encapsulation 228.

The internal structure encapsulation 228 also encapsulates the internal structure die 222. The internal structure encapsulation 228 has an internal structure protrusion 230. The internal structure protrusion 230 is attached directly to the active side 206 of the first wire-bonded die 204 with the die attach adhesive 208.

It has been discovered that the internal structure protrusion 230 can be used to support the internal structure package 216 without the use of additional spacers thus reducing the complexity and size of the integrated circuit packaging system. This allows for larger integrated circuits to be incorporated without sacrificing package height, and the reduced complexity reduces production time.

The internal structure protrusion 230 encapsulates the bond wires 210 connected to the bottom side 226 of the internal structure substrate 218 and encapsulates part of the bottom side 226 of the internal structure substrate 218 past the position of the bond wires 210.

The internal structure protrusion 230 has a planar surface 232 which helps stabilize the internal structure package 216 over the first wire-bonded die 204 and the second wire-bonded die 212 during production.

The active side 206 of the first wire-bonded die 204 is connected to the internal structure substrate 218 with internal interconnects such as solder ball interconnects 234. The first wire-bonded die 204 may have a redistribution layer or I/O ports on the active side 206, to which the solder ball interconnects 234 are connected to.

Encapsulating the internal structure package 216, the solder ball interconnects 234, the first wire-bonded die 204, the second wire-bonded die 212, and the bond wires 210 is the encapsulation 102. Mounted below the substrate 202 are external interconnects such as solder balls 238.

Figure 3:
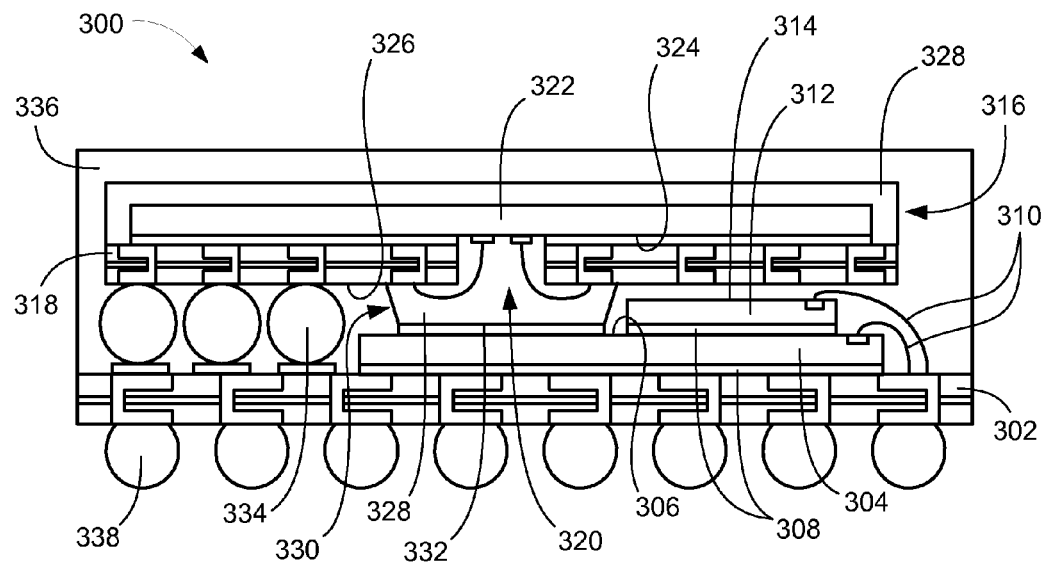
FIG. 3 is a cross-sectional view of an integrated circuit packaging system in a further embodiment of the present invention.

Referring now to FIG. 3, therein is shown a cross-sectional view of an integrated circuit packaging system 300 in a further embodiment of the present invention. The integrated circuit packaging system 300 is shown having a substrate 302 such as a ceramic or a laminated plastic substrate.

Mounted above the substrate 302 is a first integrated circuit such as a first wire-bonded die 304 with an active side 306. The first wire-bonded die 304 is attached to the substrate with a die attach adhesive 308.

The active side 306 of the first wire-bonded die 304 is connected to the substrate with interconnects such as bond wires 310. Mounted above the first wire-bonded die 304 is a second integrated circuit such as a second wire-bonded die 312 with an active side 314.

The second wire-bonded die 312 is attached to the active side 306 of the first wire-bonded die 304 with the die attach adhesive 308. The active side 314 of the second wire-bonded die is connected to the substrate 302 with the bond wires 310.

Mounted above the first wire-bonded die 304 and the second wire-bonded die 312 is an internal structure package 316. The internal structure package 316 has an internal structure substrate 318 with an internal structure substrate cavity 320.

The internal structure substrate cavity 320 of the internal structure substrate 318 exposes an internal structure die 322 between the internal structure substrate 318. The internal structure die 322 has an active side 324, which is attached to the internal structure substrate 318 with the die attach adhesive 308.

The active side 324 of the internal structure die 322 is connected to a bottom side 326 of the internal structure substrate 318 with the bond wires 310 going through the internal structure substrate cavity 320. The bond wires 310 going through the internal structure substrate cavity 320 are encapsulated in an internal structure encapsulation 328.

The internal structure encapsulation 328 also encapsulates the internal structure die 322. The internal structure encapsulation 328 has an internal structure protrusion 330. The internal structure protrusion 330 is attached directly to the active side 306 of the first wire-bonded die 304 with the die attach adhesive 308.

It has been discovered that the internal structure protrusion 330 can be used to support the internal structure package 316 without the use of additional spacers thus reducing the complexity and size of the integrated circuit packaging system. This allows for larger integrated circuits to be incorporated without sacrificing package height, and the reduced complexity reduces production time.

The internal structure protrusion 330 encapsulates the bond wires 310 connected to the bottom side 326 of the internal structure substrate 318 and encapsulates part of the bottom side 326 of the internal structure substrate 318 past the position of the bond wires 310.

The internal structure protrusion 330 has a planar surface 332 which helps stabilize the internal structure package 316 over the first wire-bonded die 304 and the second wire-bonded die 312 during production.

The substrate 302 is connected to the internal structure substrate 318 with internal interconnects such as solder ball interconnects 334. The first wire-bonded die 304 is attached to the substrate 302 beside the solder ball interconnects 334.

Encapsulating the internal structure package 316, the solder ball interconnects 334, the first wire-bonded die 304, the second wire-bonded die 312, and the bond wires 310 is an encapsulation 336.

The encapsulation 336, such as film assisted molding, protects sensitive components from moisture, dust and other contamination. Mounted below the substrate 302 are external interconnects such as solder balls 338.

Figure 4:
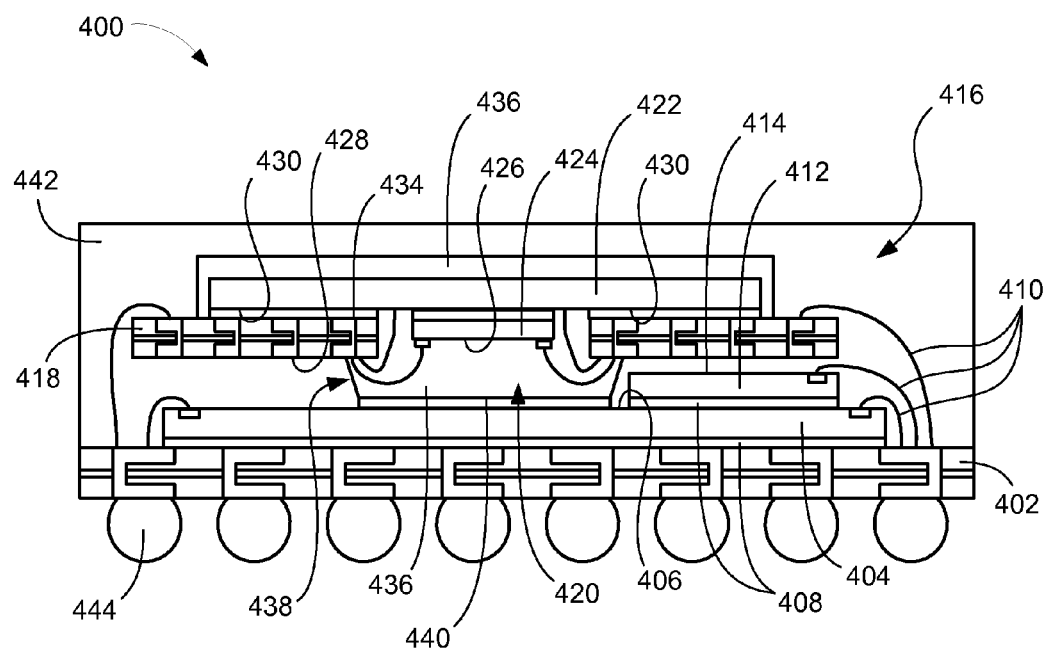
FIG. 4 is a cross-sectional view of an integrated circuit packaging system in a further embodiment of the present invention.

Referring now to FIG. 4, therein is shown a cross-sectional view of an integrated circuit packaging system 400 in a further embodiment of the present invention. The integrated circuit packaging system 400 is shown having a substrate 402 such as a ceramic or a laminated plastic substrate.

Mounted above the substrate 402 is a first integrated circuit such as a first wire-bonded die 404 with an active side 406. The first wire-bonded die 404 is attached to the substrate with a die attach adhesive 408.

The active side 406 of the first wire-bonded die 404 is connected to the substrate with interconnects such as bond wires 410. Mounted above the first wire-bonded die 404 is a second integrated circuit such as a second wire-bonded die 412 with an active side 414.

The second wire-bonded die 412 is attached to the active side 406 of the first wire-bonded die 404 with the die attach adhesive 408. The active side 414 of the second wire-bonded die is connected to the substrate 402 with the bond wires 410.

Mounted above the first wire-bonded die 404 and the second wire-bonded die 412 is an internal structure package 416. The internal structure package 416 has an internal structure substrate 418 with an internal structure substrate cavity 420.

The internal structure substrate cavity 420 of the internal structure substrate 418 exposes an internal structure die 422 between the internal structure substrate 418. Mounted to the internal structure die 422, inside the internal structure substrate cavity 420, is an internal structure substrate cavity die 424. The internal structure substrate cavity die is attached to the internal structure die 422 with the die attach adhesive 408.

The internal structure substrate cavity die 424 has an active side 426, which is connected to a bottom side 428 of the internal structure substrate 418 with the bond wires 410. The internal structure die 422 is attached above the internal structure substrate 418 with the die attach adhesive 408.

The internal structure die 422 has an active side 430 connected to the internal structure substrate 418 with the bond wires 410. A top side 434 of the internal structure substrate 418 is connected to the substrate 402 with the bond wires 410.

The internal structure die 422, the internal structure substrate cavity die 424, and the bond wires 410 connecting the internal structure substrate cavity die 424 to the internal structure substrate are encapsulated in an internal structure encapsulation 436.

The internal structure encapsulation 436 has an internal structure protrusion 438. The internal structure protrusion 438 is attached directly to the active side 406 of the first wire-bonded die 404 with the die attach adhesive 408.

It has been discovered that the internal structure protrusion 438 can be used to support the internal structure package 416 without the use of additional spacers thus reducing the complexity and size of the integrated circuit packaging system. This allows for larger integrated circuits to be incorporated without sacrificing package height, and the reduced complexity reduces production time.

The internal structure protrusion 438 encapsulates the bond wires 410 connected to the bottom side 428 of the internal structure substrate 418 and encapsulates part of the bottom side 428 of the internal structure substrate 418 past the position of the bond wires 410.

The internal structure encapsulation 436 does not encapsulate the bond wires 410 connecting the top side 434 of the internal structure substrate 418 to the substrate 402. The internal structure protrusion 438 has a planar surface 440 which helps stabilize the internal structure package 416 over the first wire-bonded die 404 and the second wire-bonded die 412 during production.

Encapsulating the internal structure package 416, the first wire-bonded die 404, the second wire-bonded die 412 and the bond wires 410 is an encapsulation 442.

The encapsulation 442, such as film assisted molding, protects sensitive components from moisture, dust and other contamination. Mounted below the substrate 402 are external interconnects such as solder balls 444.

Figure 5:
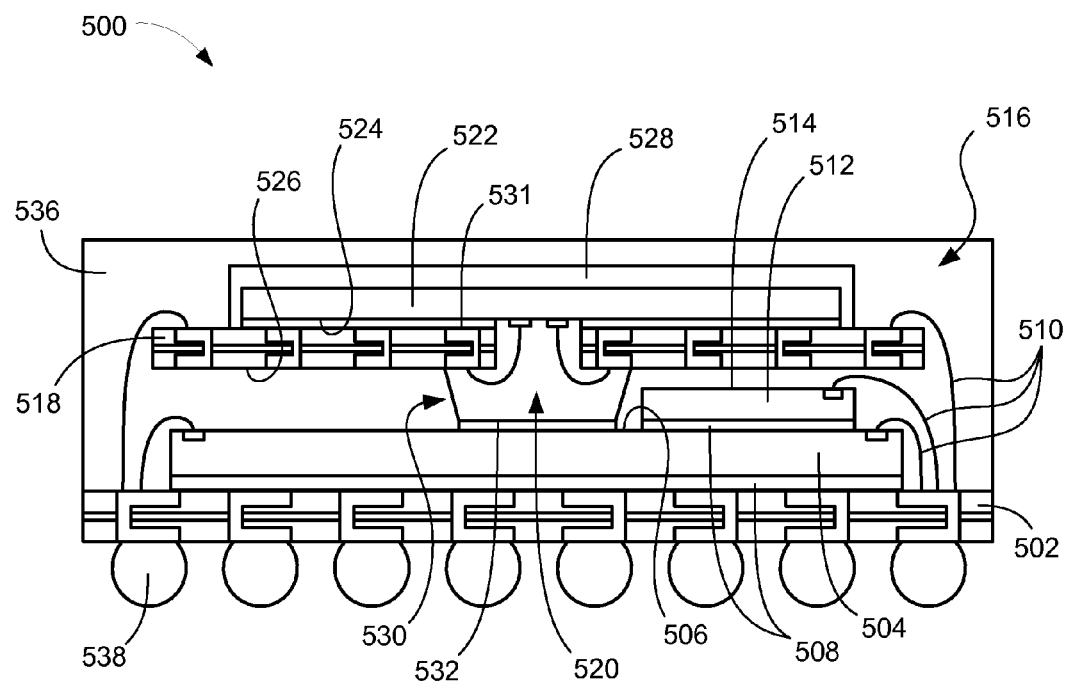
FIG. 5 is a cross-sectional view of an integrated circuit packaging system in a further embodiment of the present invention.

Referring now to FIG. 5, therein is shown a cross-sectional view of an integrated circuit packaging system 500 in a further embodiment of the present invention. The integrated circuit packaging system 500 is shown having a substrate 502 such as a ceramic or a laminated plastic substrate.

Mounted above the substrate 502 is a first integrated circuit such as a first wire-bonded die 504 with an active side 506. The first wire-bonded die 504 is attached to the substrate with a die attach adhesive 508.

The active side 506 of the first wire-bonded die 504 is connected to the substrate with interconnects such as bond wires 510. Mounted above the first wire-bonded die 504 is a second integrated circuit such as a second wire-bonded die 512 with an active side 514.

The second wire-bonded die 512 is attached to the active side 506 of the first wire-bonded die 504 with the die attach adhesive 508. The active side 514 of the second wire-bonded die is connected to the substrate 502 with the bond wires 510.

Mounted above the first wire-bonded die 504 and the second wire-bonded die 512 is an internal structure package 516. The internal structure package 516 has an internal structure substrate 518 with an internal structure substrate cavity 520.

The internal structure substrate cavity 520 of the internal structure substrate 518 exposes an internal structure die 522 between the internal structure substrate 518. The internal structure die 522 has an active side 524, which is attached to the internal structure substrate 518 with the die attach adhesive 508.

The active side 524 of the internal structure die 522 is connected to a bottom side 526 of the internal structure substrate 518 with the bond wires 510 going through the internal structure substrate cavity 520. The bond wires 510 going through the internal structure substrate cavity 520 are encapsulated in an internal structure encapsulation 528.

The internal structure encapsulation 528 also encapsulates the internal structure die 522. The internal structure encapsulation 528 has an internal structure protrusion 530. The internal structure protrusion 530 is attached directly to the active side 506 of the first wire-bonded die 504 with the die attach adhesive 508. The internal structure protrusion 530 supports the internal structure package 516 above the first wire-bonded die 504 and creates a gap 802 between the internal structure package 516 and the first wire-bonded die 504 and allows the internal structure package 516 to have an edge 804 over an edge 806 of the first wire-bonded die 504.

It has been discovered that the internal structure protrusion 530 can be used to support the internal structure package 516 without the use of additional spacers thus reducing the complexity and size of the integrated circuit packaging system. This allows for larger integrated circuits to be incorporated without sacrificing package height, and the reduced complexity reduces production time.

The internal structure protrusion 530 encapsulates the bond wires 510 connected to the bottom side 526 of the internal structure substrate 518 and encapsulates part of the bottom side 526 of the internal structure substrate 518 past the position of the bond wires 510.

A top side 531 of the internal structure substrate 518 is connected to the substrate 502 with the bond wires 510. The internal structure encapsulation 528 does not encapsulate the bond wires 510 connecting the top side 531 of the internal structure substrate 518 to the substrate 502.

The internal structure protrusion 530 has a planar surface 532 which helps stabilize the internal structure package 516 over the first wire-bonded die 504 and the second wire-bonded die 512 during production.

Encapsulating the internal structure package 516, the first wire-bonded die 504, the second wire-bonded die 512 and the bond wires 510 is an encapsulation 536. The encapsulation 536, such as film assisted molding, protects sensitive components from moisture, dust and other contamination. Mounted below the substrate 502 are external interconnects such as solder balls 538.

Figure 6:
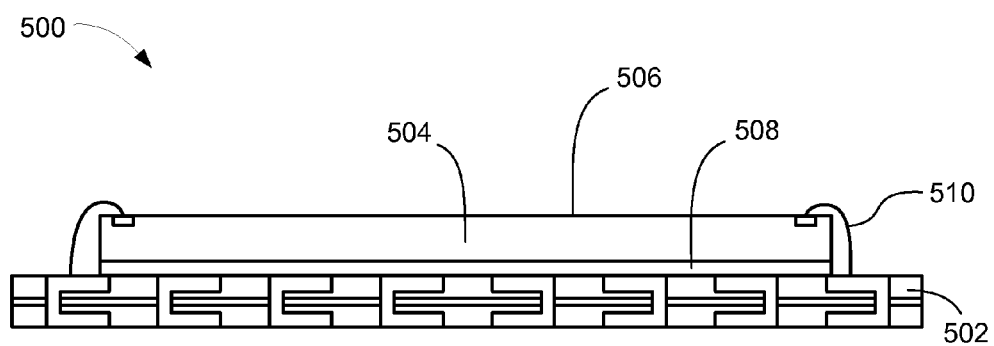
FIG. 6 is the integrated circuit packaging system of FIG. 5 after a first die attach phase of manufacture.

Referring now to FIG. 6, therein is shown the integrated circuit packaging system 500 of FIG. 5 after a first die attach phase of manufacture. The integrated circuit packaging system 500 is shown having the substrate 502 with the first wire-bonded die 504 attached with the die attach adhesive 508. The active side 506 of the first wire-bonded die 504 is also shown connected to the substrate 502 with the bond wires 510.

Figure 7:
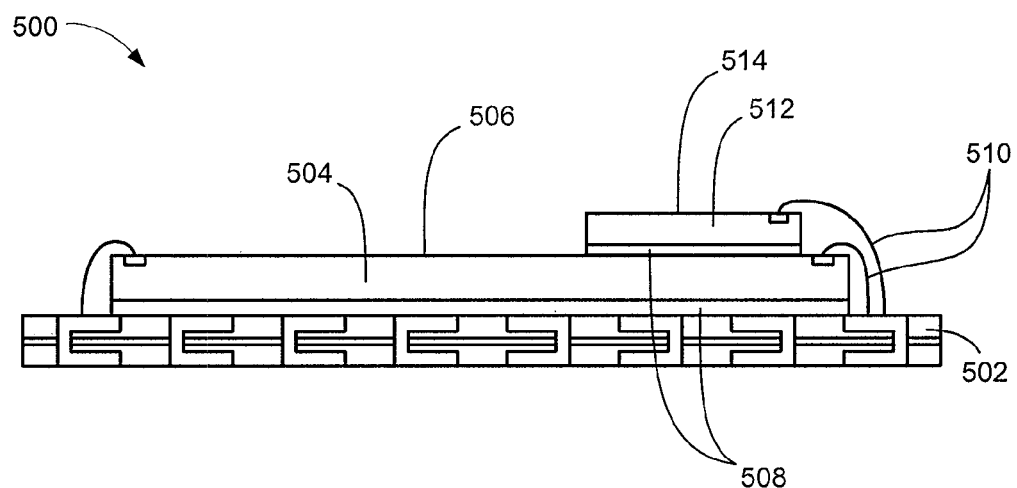
FIG. 7 is the integrated circuit packaging system of FIG. 5 after a second die attach phase of manufacture.

Referring now to FIG. 7, therein is shown the integrated circuit packaging system 500 of FIG. 5 after a second die attach phase of manufacture. The integrated circuit packaging system 500 is shown having the second wire-bonded die 512 attached to the first wire-bonded die 504 with the die attach adhesive 508. The active side 514 of the second wire-bonded die 512 is also shown connected to the substrate 502 with the bond wires 510.

Figure 8:
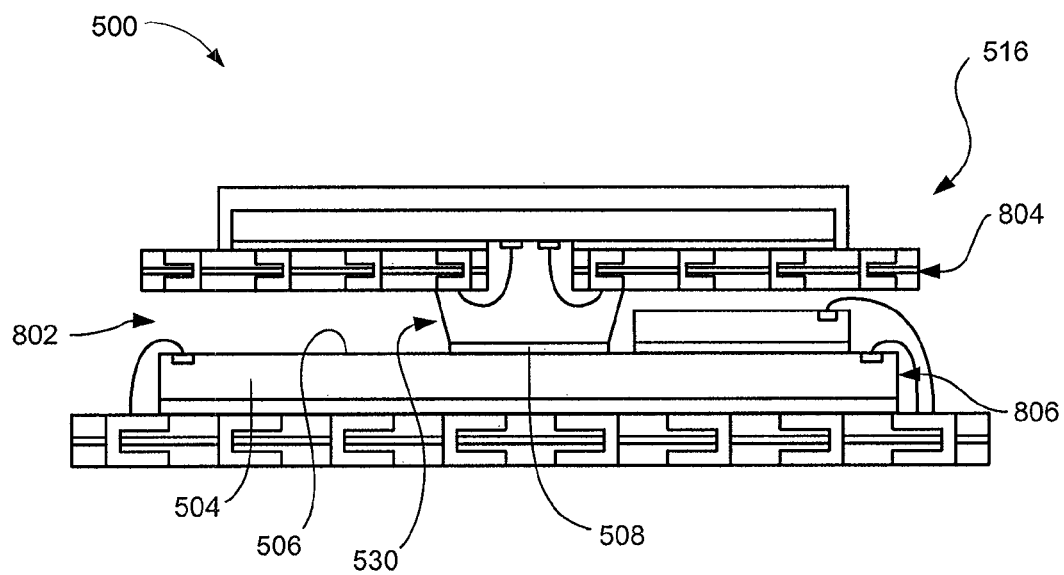
FIG. 8 is the integrated circuit packaging system of FIG. 5 after an internal structure package attach phase of manufacture.

Referring now to FIG. 8, therein is shown the integrated circuit packaging system 500 of FIG. 5 after an internal structure package attach phase of manufacture. The integrated circuit packaging system 500 is shown having the internal structure protrusion 530 of the internal structure package 516 attached to the active side 506 of the first wire-bonded die 504 with the die attach adhesive 508.

Figure 9:
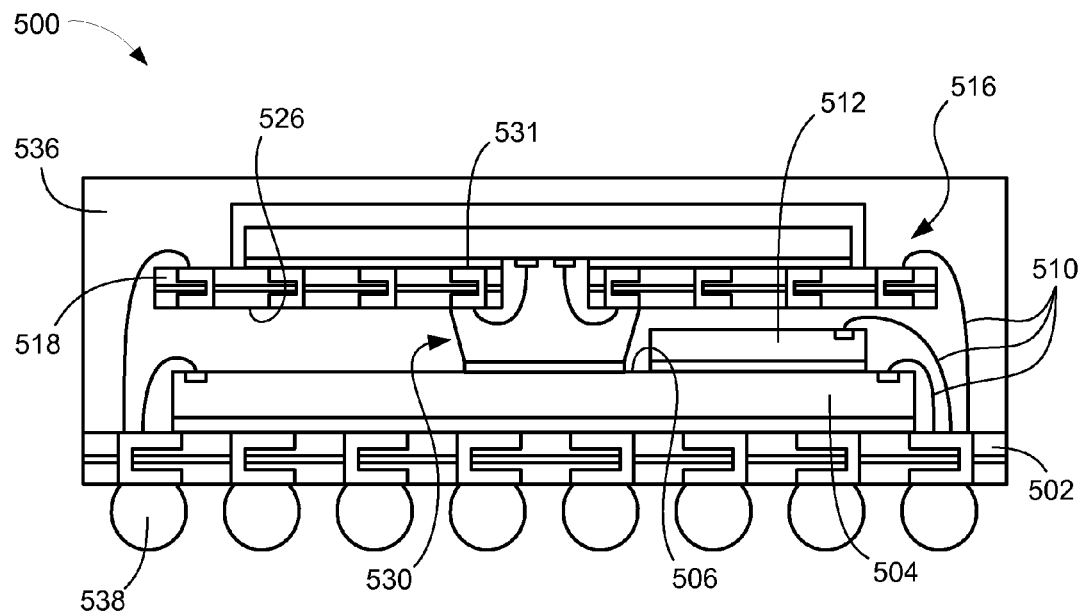
FIG. 9 is the integrated circuit packaging system of FIG. 5 after a wire-bonding, molding, and bump attach phase of manufacture.

Referring now to FIG. 9, therein is shown the integrated circuit packaging system 500 of FIG. 5 after a wire-bonding, molding, and bump attach phase of manufacture. The integrated circuit packaging system 500 is shown having the top side 531 of the internal structure substrate 518 connected to the substrate 502 with the bond wires 510.

The internal structure package 516, the bond wires 510, the first wire-bonded die 504, and the second wire-bonded die 512 is also encapsulated with the encapsulation 536. The solder balls 538 have been attached below the substrate 502.

Figure 10:
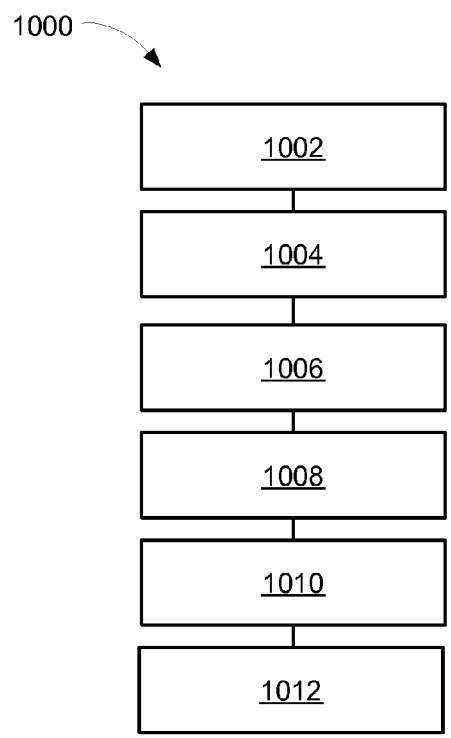
FIG. 10 is a flow chart of a method of manufacture of an integrated circuit packaging system in a further embodiment of the present invention.

Referring now to FIG. 10, therein is shown a flow chart of a method 1000 of manufacture of an integrated circuit packaging system in an embodiment of the present invention. The method 1000 includes providing an internal structure substrate having an internal structure substrate cavity in a block 1002; mounting an internal structure die above the internal structure substrate in a block 1004; encapsulating the internal structure die with an internal structure encapsulation to form an internal structure package in a block 1006; forming an internal structure protrusion in the internal structure encapsulation below the internal structure substrate cavity in a block 1008; mounting the internal structure package above a substrate in a block 1010; and encapsulating the internal structure package above the substrate with an encapsulation in a block 1012.

It has been discovered that the present invention thus has numerous aspects.

A principle aspect that has been unexpectedly discovered is that the present invention can be used to support the internal structure package without the use of additional spacers thus reducing the complexity and size of the integrated circuit packaging system. This allows for larger integrated circuits to be incorporated without sacrificing package height, and the reduced complexity reduces production time.

Another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the internal structure protrusion system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing an internal structure substrate having an internal structure substrate cavity;
   mounting an internal structure die above the internal structure substrate;
   encapsulating the internal structure die with an internal structure encapsulation to form an internal structure package;
   forming an internal structure protrusion of the internal structure encapsulation below the internal structure substrate cavity;
   mounting the internal structure package above a first integrated circuit and the internal structure package is over an edge of the first integrated circuit and the internal structure protrusion is attached directly to an active side of the first integrated circuit creating a gap between the internal structure package and the first integrated circuit;
   wherein:
   mounting the internal structure package includes mounting the internal structure package above a substrate; and
   further comprising:
   encapsulating the internal structure package above the substrate with an encapsulation.

2. The method as claimed in claim 1 further comprising:
   connecting a bottom surface of the internal structure substrate to the substrate with internal interconnects.

3. The method as claimed in claim 1 further comprising:
   connecting the internal structure die to the internal structure substrate with interconnects.

4. The method as claimed in claim 1 wherein:
   forming the internal structure protrusion includes forming an internal structure protrusion having a planar surface.

5. The method as claimed in claim 1 further comprising:
   mounting an internal structure substrate cavity die inside the internal structure substrate cavity of the internal structure substrate.

6. A method of manufacture of an integrated circuit packaging system comprising:
   providing a substrate;
   mounting a first integrated circuit above the substrate;
   connecting the first integrated circuit to the substrate with an interconnect;
   providing an internal structure substrate having an internal structure substrate cavity;
   mounting an internal structure die above the internal structure substrate;
   encapsulating the internal structure die with an internal structure encapsulation to form an internal structure package;
   forming an internal structure protrusion of the internal structure encapsulation below the internal structure substrate cavity;
   mounting the internal structure package above a substrate and above the first integrated circuit and the internal structure package is over an edge of the first integrated circuit and the internal structure protrusion is attached directly to an active side of the first integrated circuit creating a gap between the internal structure package and the first integrated circuit; and
   encapsulating the internal structure package and the first integrated circuit above the substrate with an encapsulation.

7. The method as claimed in claim 6 further comprising:
   attaching the internal structure protrusion to the first integrated circuit with a die attach adhesive.

8. The method as claimed in claim 6 further comprising:
   connecting a bottom surface of the internal structure substrate to the first integrated circuit with an internal interconnect.

9. The method as claimed in claim 6 further comprising:
   connecting a top surface of the internal structure substrate to the substrate with the interconnect.

10. The method as claimed in claim 6 further comprising:
    mounting a second integrated circuit above the first integrated circuit.

11. An integrated circuit packaging system comprising:
    an internal structure substrate having an internal structure substrate cavity;
    an internal structure die mounted above the internal structure substrate;
    an internal structure encapsulation encapsulating the internal structure die to form an internal structure package;
    an internal structure protrusion formed of the internal structure encapsulation below the internal structure substrate cavity;
    a first integrated circuit mounted below the internal structure package and the internal structure package is over an edge of the first integrated circuit and the internal structure protrusion is attached directly to an active side of the first integrated circuit creating a gap between the internal structure package and the first integrated circuit;
    a substrate mounted below the internal structure package; and
    an encapsulation encapsulating the internal structure package above the substrate.

12. The system as claimed in claim 11 further comprising:
    a bottom surface of the internal structure substrate connected to the substrate with internal interconnects.

13. The system as claimed in claim 11 further comprising:
    the internal structure die connected to the internal structure substrate with interconnects.

14. The system as claimed in claim 11 wherein:
    the internal structure protrusion has a planar surface.

15. The system as claimed in claim 11 further comprising:
    an internal structure substrate cavity die mounted inside the internal structure substrate cavity of the internal structure substrate.

16. The system as claimed in claim 11 further comprising:
    an interconnect connecting the first integrated circuit to the substrate.

17. The system as claimed in claim 16 further comprising:
    a die attach adhesive that attaches the internal structure protrusion to the first integrated circuit.

18. The system as claimed in claim 16 further comprising:
a bottom surface of the internal structure substrate connected to the first integrated circuit with an internal interconnect.

19. The system as claimed in claim 16 further comprising:
a top surface of the internal structure substrate connected to the substrate with the interconnect.

20. The system as claimed in claim 16 further comprising:
a second integrated circuit mounted above the first integrated circuit.

* * * * *